US006180867B1

(12) United States Patent
Hedengren et al.

(10) Patent No.: US 6,180,867 B1
(45) Date of Patent: Jan. 30, 2001

(54) THERMAL SENSOR ARRAY AND METHODS OF FABRICATION AND USE

(75) Inventors: Kristina Helena Valborg Hedengren; William Paul Kornrumpf; Mark Lloyd Miller, all of Schenectady; Beale Hibbs Opsahl-Ong, Clifton Park; Egidijus Edward Uzgiris, Schenectady, all of NY (US)

(73) Assignee: General Electric Company, Schenectady, NY (US)

( * ) Notice: Under 35 U.S.C. 154(b), the term of this patent shall be extended for 0 days.

(21) Appl. No.: 09/395,135

(22) Filed: Sep. 13, 1999

Related U.S. Application Data

(63) Continuation-in-part of application No. 09/313,531, filed on May 12, 1999, now Pat. No. 6,084,174, which is a continuation of application No. 08/632,809, filed on Apr. 17, 1996, now Pat. No. 5,909,004.

(60) Provisional application No. 60/128,741, filed on Apr. 12, 1999.

(51) Int. Cl.$^7$ ........................................... H01L 35/00
(52) U.S. Cl. .................... 136/201; 136/213; 136/233; 374/179
(58) Field of Search ........................ 136/200, 201, 136/213, 224, 225, 227, 230, 232, 233; 374/179

(56) References Cited

U.S. PATENT DOCUMENTS

| 1,552,284 | 9/1925 | Evins | 136/224 |
|---|---|---|---|
| 1,610,271 | 12/1926 | Evins | 136/224 |
| 1,622,887 | 3/1927 | Smith | 136/224 |
| 1,648,939 | 11/1927 | Evins | 136/224 |
| 1,715,316 | 5/1929 | Thwing | 136/224 |
| 1,752,117 | 3/1930 | Smith | 136/224 |
| 3,219,993 | 11/1965 | Schwertz | 340/324 |
| 3,554,815 | 1/1971 | Osborn | 136/203 |
| 4,001,046 | 1/1977 | Weiss et al. | 136/205 |
| 4,047,436 | 9/1977 | Bernard et al. | 73/362 SC |
| 4,343,960 | 8/1982 | Eguchi et al. | 136/225 |
| 4,488,269 | 12/1984 | Robinson et al. | 136/213 |
| 4,490,053 | 12/1984 | Coston et al. | 374/5 |
| 4,513,201 | 4/1985 | Falk | 250/342 |
| 4,558,342 | 12/1985 | Sclar | 357/30 |
| 4,631,350 | 12/1986 | Germanton et al. | 136/225 |
| 5,180,440 | 1/1993 | Siegel et al. | 136/230 |
| 5,411,600 | 5/1995 | Rimai et al. | 136/225 |
| 5,452,182 | 9/1995 | Eichelberger et al. | 361/749 |
| 5,560,711 | 10/1996 | Bu | 374/109 |

FOREIGN PATENT DOCUMENTS

| 2238252 | 2/1975 | (FR) . |
|---|---|---|
| 58-10875 | 1/1983 | (JP) . |

OTHER PUBLICATIONS

J. Folkman, Tumor Angiogenesis: Therapeutic Implications New England J. of Medicine, 285:1182–1186, 1971.
N. Weidner et al, Tumor Angiogenesis and Metastasis–Correlation in Invasive Breast Carcinoma New England J of Medicine, 324:1–8, 1991.

Primary Examiner—Kathryn Gorgos
Assistant Examiner—Thomas H. Parsons
(74) Attorney, Agent, or Firm—Ann M. Agosti; Jill M. Breedlove

(57) ABSTRACT

A thermal sensor array includes a dielectric layer including a plurality of individual thermal sensors and a pattern of deposited electrical interconnections facing at least one surface of the dielectric layer for providing electrical connections from each of the plurality of individual thermal sensors, the dielectric layer and the pattern of deposited electrical interconnections being surface-conformable. The thermal sensor array can be used in a diagnostic tool that further includes: a scanning device coupled to the pattern of deposited electrical interconnections for obtaining sensor signals from the thermal sensors; and a computer for processing the sensor signals to estimate temperature distributions.

34 Claims, 16 Drawing Sheets

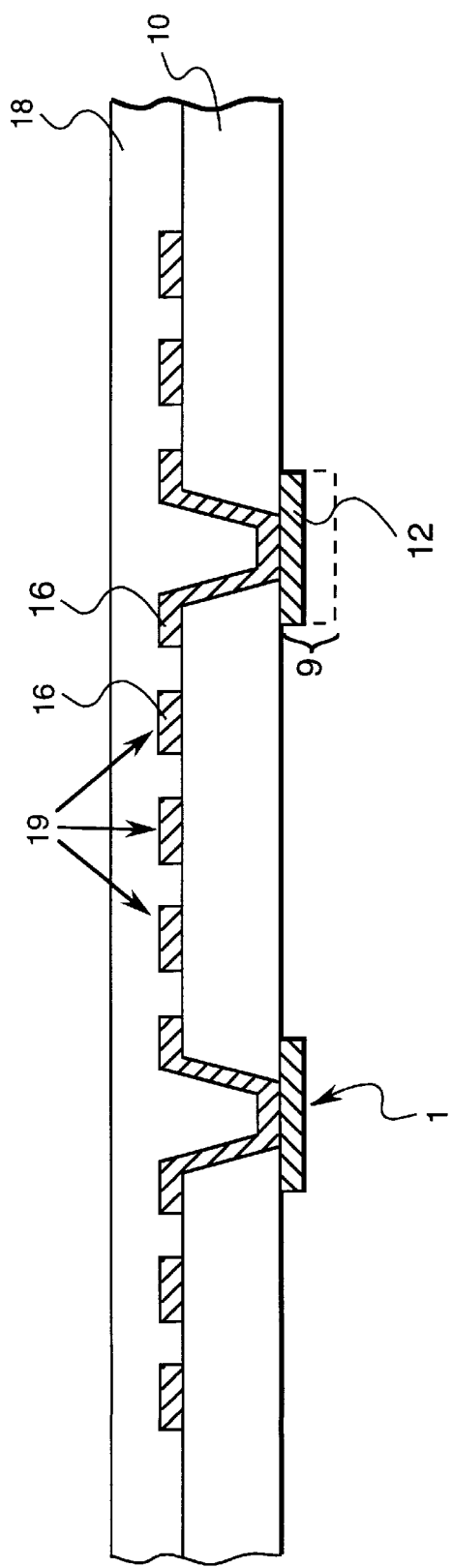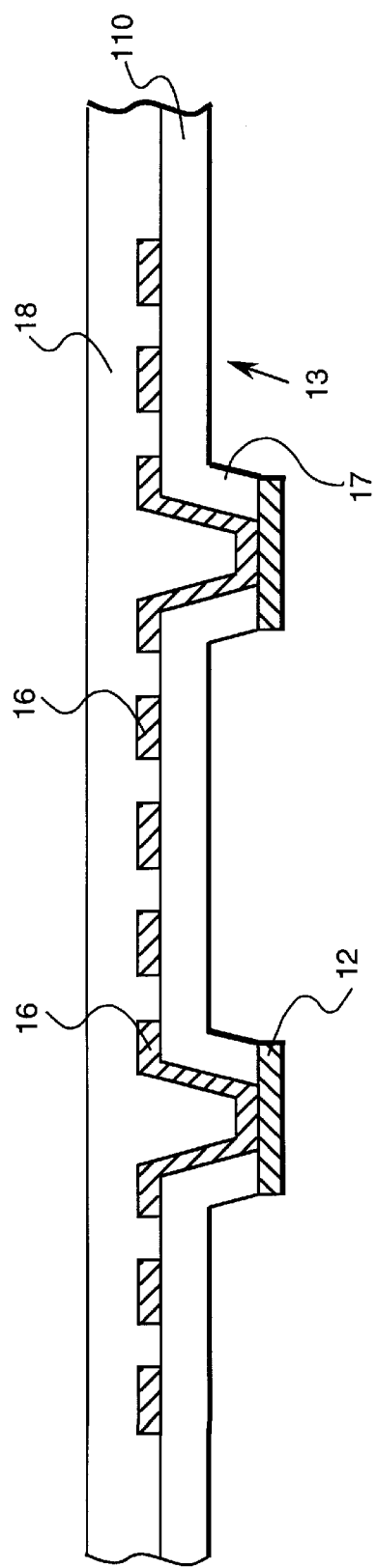

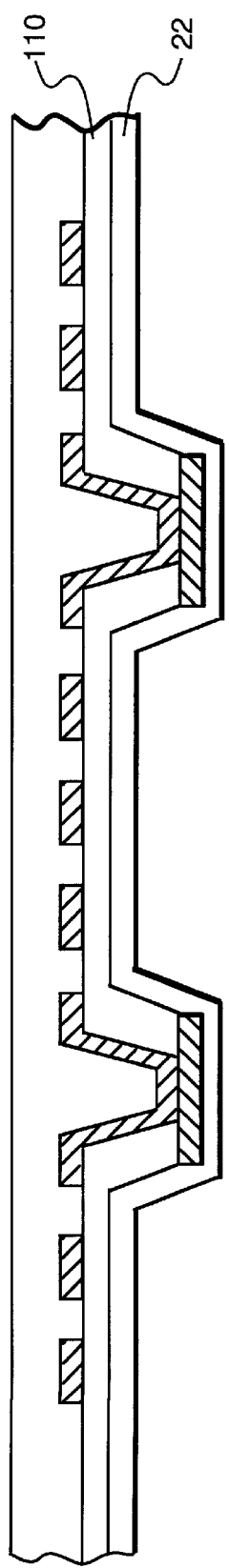
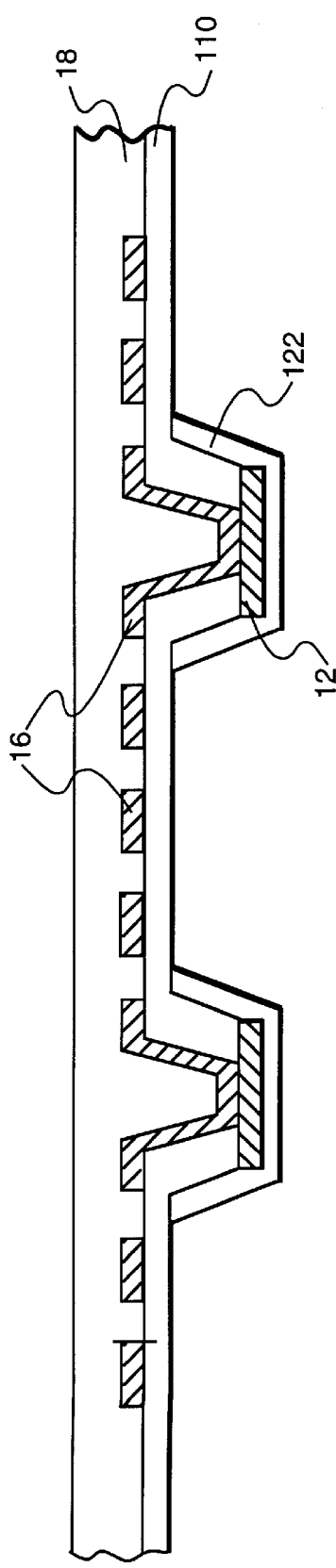
FIG. 7
FIG. 8

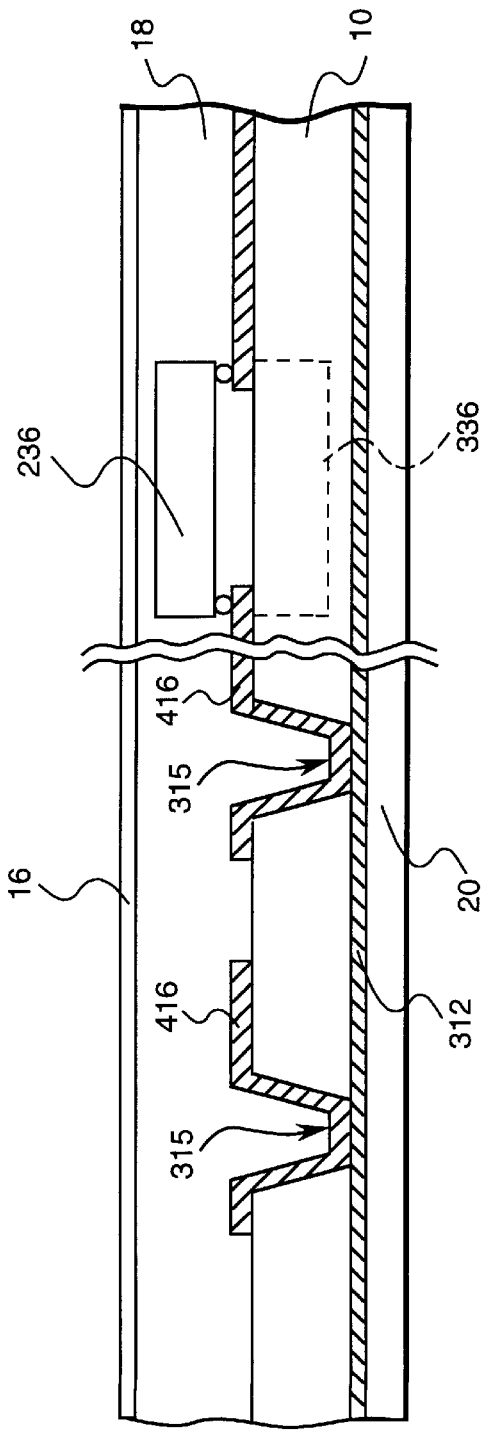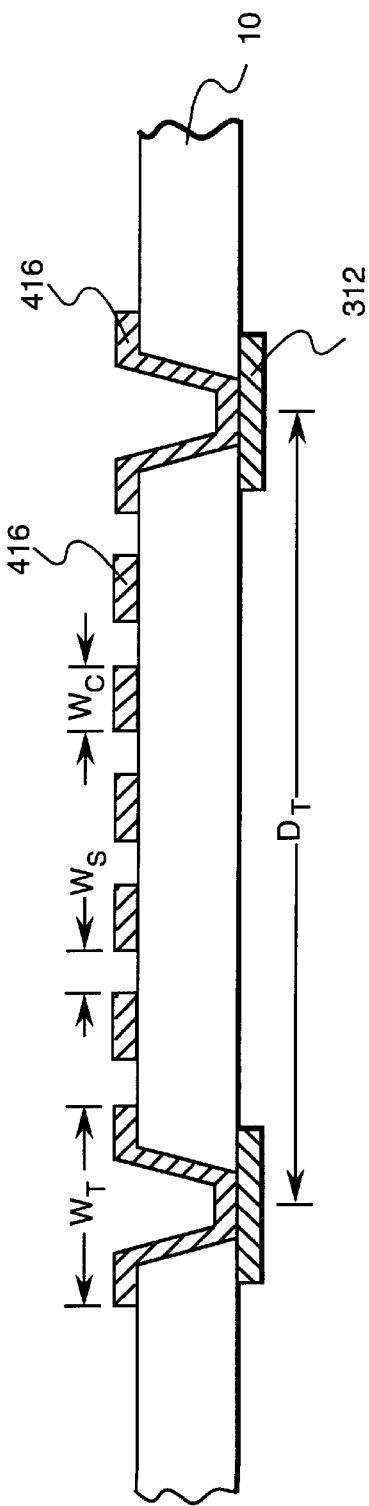
FIG. 13
FIG. 14

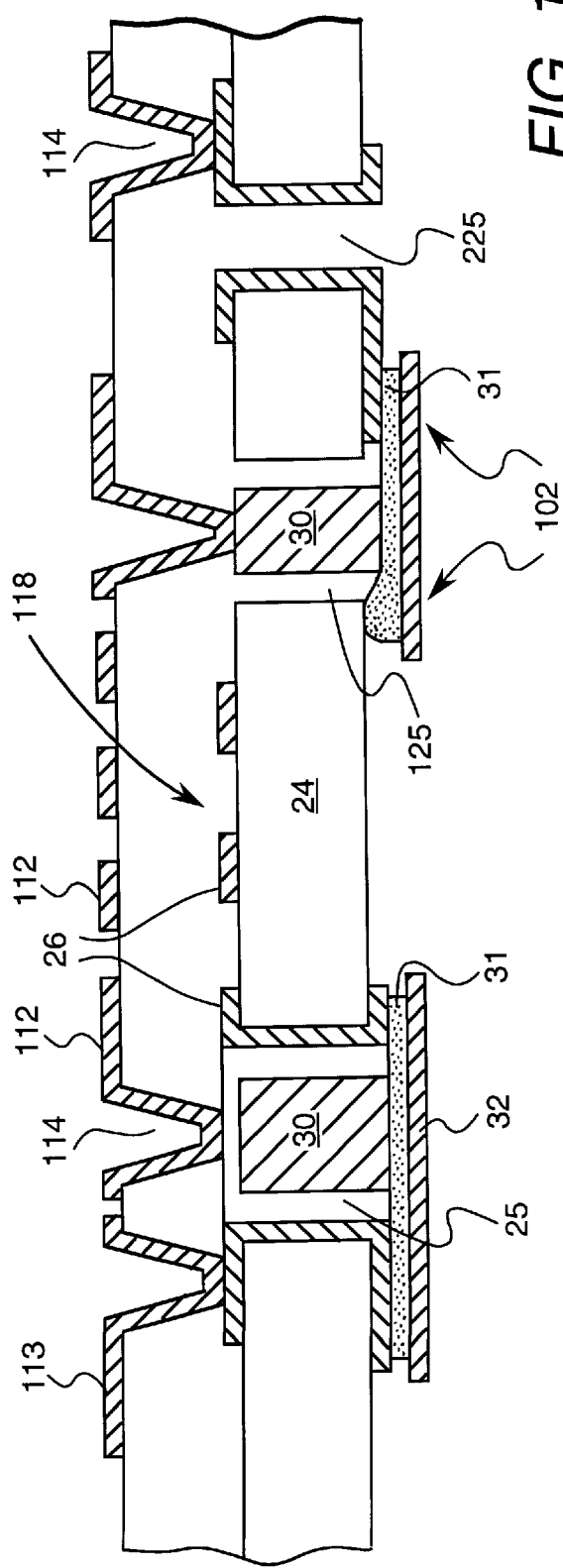
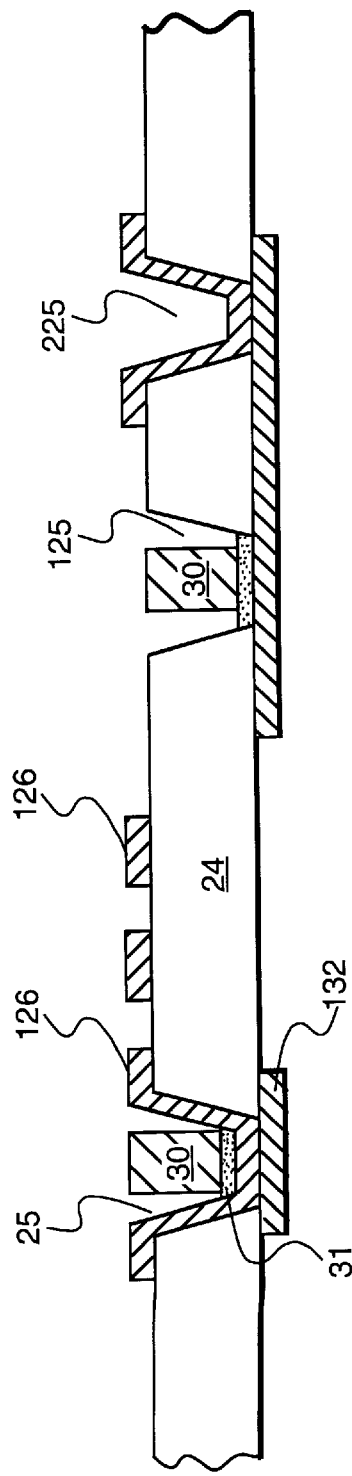
FIG. 18
FIG. 19

THERMAL SENSOR ARRAY AND METHODS OF FABRICATION AND USE

CROSS REFERENCE TO RELATED APPLICATIONS

This application claims the benefit of Provisional Application no. 60/128,741, Apr. 12, 1999, which is a continuation-in-part of application Ser. No. 08/313,531, May 12, 1999, U.S. Pat. No. 6,084,174, which is a continuation of application Ser. No. 08/632,809, Apr. 17, 1996, U.S. Pat. No. 5,909,004.

BACKGROUND OF THE INVENTION

1. Field of the Invention

The present invention relates generally to thermal sensors and more particularly to thermal sensors for thermography.

2. Description of the Related Art

Conventional breast cancer screening techniques are based on detection and evaluation of tissue mass structure. X-Ray mammography is commonly uses for breast cancer screening. Several drawbacks of X-Ray mammography include: (a) exposure of a population to systematic doses of radiation; (b) reduced effectiveness of X-Ray mammography in the case of dense breasts (a relatively common condition among young women); (c) reluctance of some women to undergo the uncomfortable procedure; and (d) inability of X-Ray mammography to detect early tumors of small size. For detection, the mass must be of a minimum size.

It has been shown that angiogenesis (the recruitment of new blood vessels from existing vessels) is a necessary condition for all solid tumors to grow beyond a diameter of several millimeters (J. Folkman, New England J. of Medicine, 285:1182–1186, 1971; N. Weidner et. al. , New England J of Medicine, 324:1–8,1991). The increased blood vasculature and blood perfusion associated with early tumor growth together with the increased metabolic output of tumors that are growing are hypothesized to lead to higher tumor temperatures than found for surrounding tissues. This hypothesis has been verified in a qualitative manner for tumors that are near the surface of skin in the case of breast cancer. Thus, thermographic sensing with an appropriate technique that is sensitive enough and is free of errors caused by other environmental factors would be useful as a screening method for cancer, particularly for breast cancer.

In applications such as aforementioned U.S. Pat. No. 5,909,004, thermographic sensors are used to measure thermal temperature gradients. To minimize the perturbation of the thermal temperatures being measured, the sensor must have minimal lateral thermal conductivity. In addition, the thermal time constant and mass must be minimized so that rapid reading of the temperatures can be accomplished. In the field of thermography, the surface temperature of the human body is mapped to provide information that is indicative of early tumor growth.

Infrared (IR) cameras or imagers have been used to attempt to measure small temperature gradients. An example of a thermoelectric infrared detector array can be found in Sclar, U.S. Pat. No. 4,558,342. Measurements of temperature distributions in human tissue to detect tumors must map the surface temperature accurately so that any contribution from internal tumors can be properly detected. Infrared sensors (which cannot be in direct contact with skin) can yield unreliable temperature data due in part to effects of ambient air flow on the skin surface and due to variations in skin emissivity and orientation relative to the infrared sensor. Skin emissivity can be a particularly insidious problem in practice and varies due to the presence of a variety of substances on the skin such as oil, water or particulate debris. Variations in emissivity cause apparent changes in temperature as sensed by the infrared camera that mask the underlying true temperature gradients on the skin.

SUMMARY OF THE INVENTION

Thus, there is a need of a noninvasive, harmless method and apparatus for measuring spatial and/or temporal temperature gradients in biological tissue for screening for angiogenesis and metabolic changes associated with very early tumor development and for monitoring changes in tumor size.

It would additionally be desirable to provide improved thermal sensors while minimizing sensor effects on the thermal field being measured.

It would further be desirable to provide improved detection systems that measure other parameters than the emissive characteristics of the surface and also have a reduced need for calibration and tight environment control, to process resulting data digitally to improve the detection sensitivity, and to provide fixturing devices to help stabilize data acquisition and localize signal position.

In one embodiment of the present invention, an array of temperature sensors is interconnected using thin film interconnects and attached to a low thermal conductivity, low thermal mass material to provide a sensor array with reduced lateral thermal conductivity and losses. In contrast to IR imaging techniques which measure IR and infer temperature while taking emissivity into account (temperature T=function of emissivities and detected IR signals), the present invention can be used to provide direct contact voltage measurements that can be converted to corresponding temperature values with less complexity and likelihood of error (T=voltage signal V * constant K).

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 5–8 are side views showing several other thermocouple embodiments of the present invention related to those of FIGS. 3–4.

FIGS. 13 and 14 are side views of portions of FIGS. 11 and 12.

FIGS. 16–18 are side views of stages in a thermistor array fabrication sequence according to another embodiment of the present invention.

FIG. 19 is a circuit schematic top view of an alternative thermistor array embodiment of the present invention.

DETAILED DESCRIPTION OF THE DRAWINGS

Figure 1:
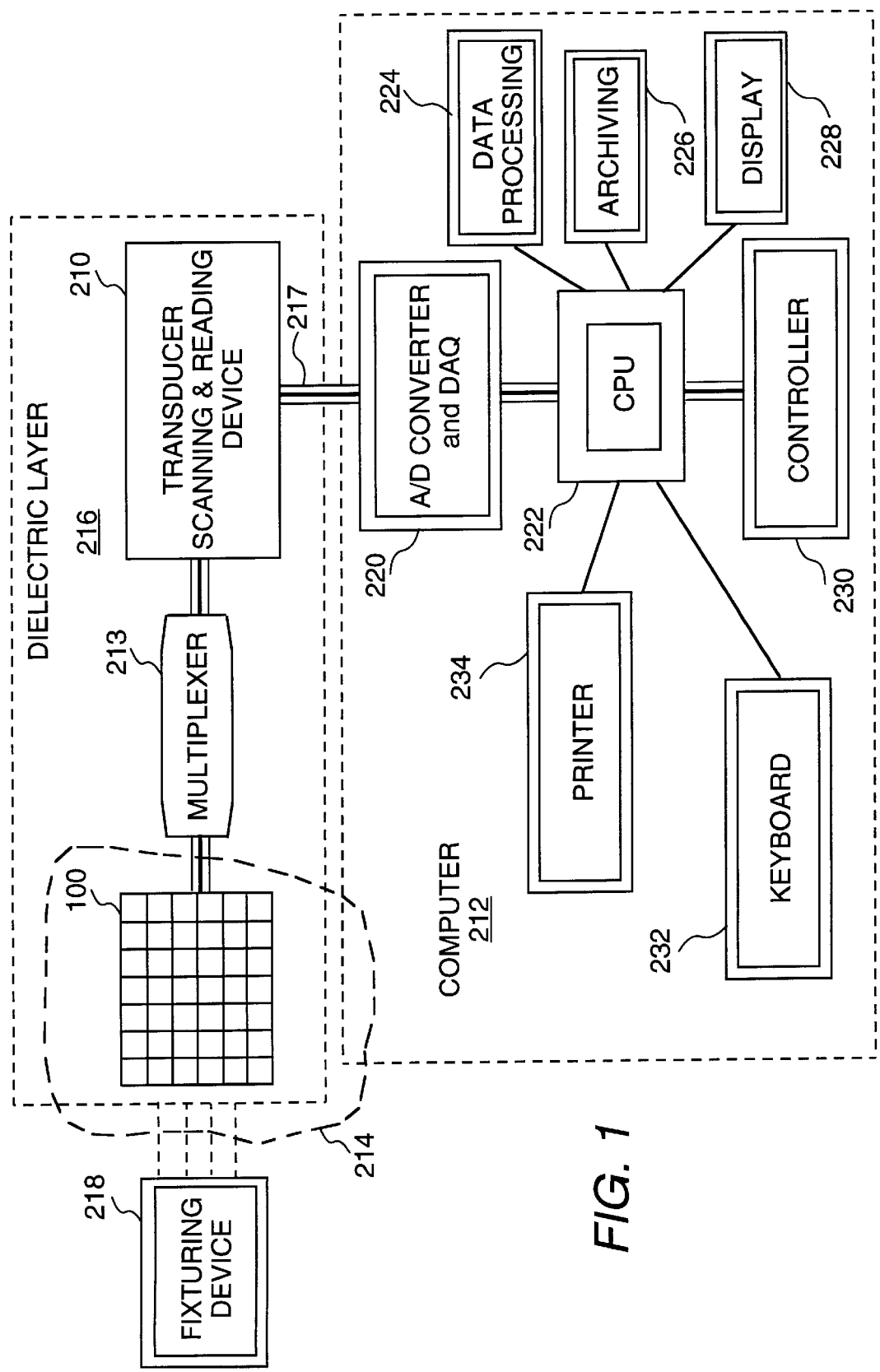
FIG. 1 is a block diagram of a diagnostic tool according to one embodiment of the present invention.
Figure 2:
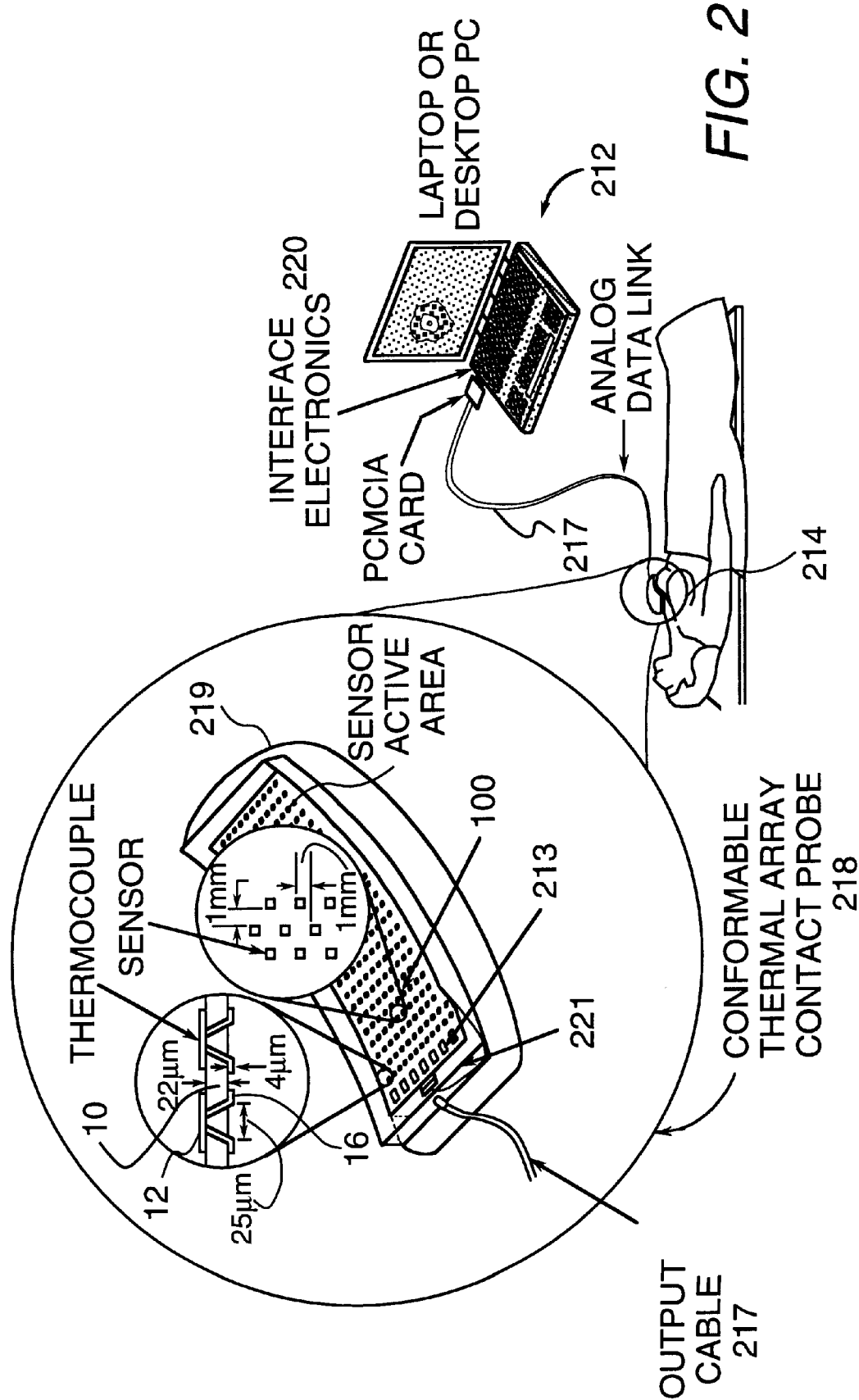
FIG. 2 is a perspective diagram of one embodiment in which the diagnostic tool of FIG. 1 can be applied.

FIG. 1 is a block diagram of a diagnostic tool according to one embodiment of the present invention including a thermal sensor array 100, a scanning device 210 coupled to thermal sensors of the thermal sensor array, and a computer 212 for processing sensor signals to estimate temperature distributions. FIG. 2 is a perspective diagram of one embodiment in which the diagnostic tool of FIG. 1 can be applied.

According to several embodiments of the present invention discussed in more detail below with respect to FIGS. 3–23, a thermal sensor array comprises a dielectric layer 216 (FIG. 1) including a plurality of individual thermal sensors and a pattern of deposited electrical interconnections facing at least one surface of the dielectric layer for providing electrical connections from each of the plurality of individual thermal sensors with the dielectric layer and the pattern of deposited electrical interconnections being surface-conformable.

"Surface-conformable" is intended herein to mean sufficiently flexible to conform to the surface of an anatomical structure such as breast tissue that has been pressed against a chest wall in a manner such that most of the individual thermal sensors are capable of providing signals representative of temperatures of the surface. Although surface-conformable thermal sensor arrays are preferable for many applications, a rigid or flat sensor can alternatively be used for many applications.

Figure 20:
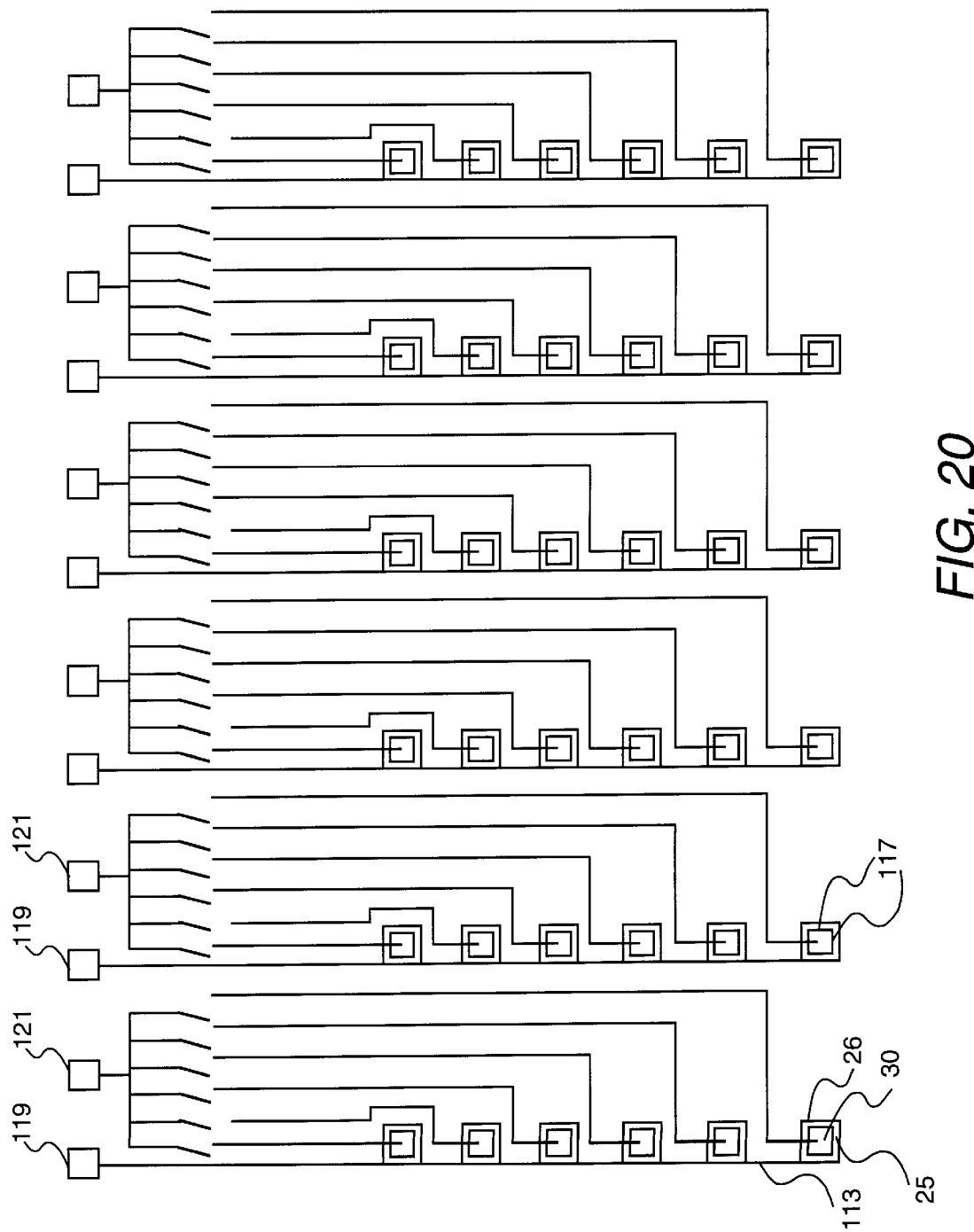
FIG. 20 is a circuit schematic top view of a thermistor array embodiment of the present invention.
Figure 21:
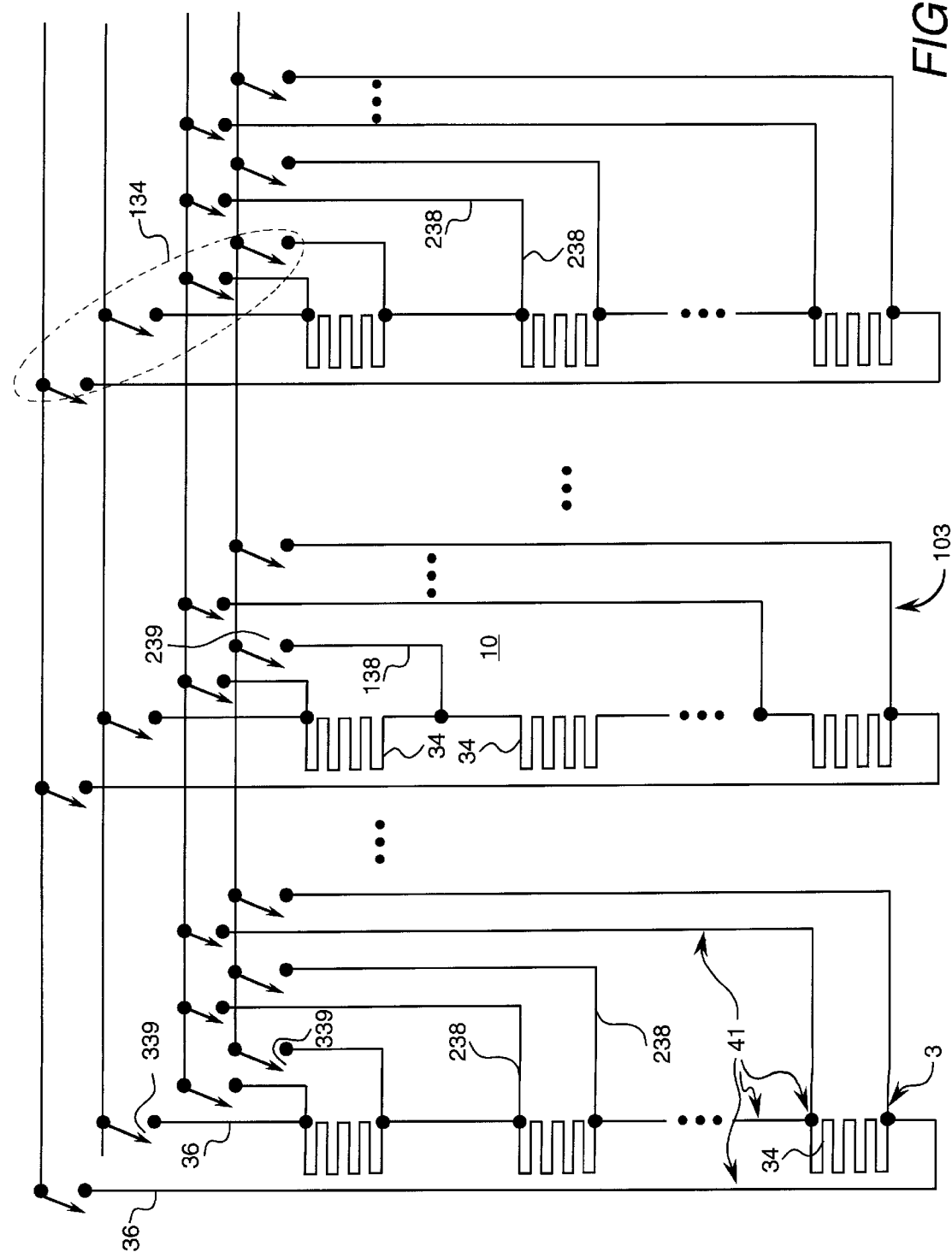
FIG. 21 is a top view of a resistance temperature detector array embodiment of the present invention.

For purposes of example, FIGS. 3–15 relate to thermocouple embodiments, FIGS. 16–20 relate to thermistor embodiments, and FIG. 21 relates to a resistance temperature detector embodiment. Other types of thermal sensors (such as thermopiles, for example) that can be integrated with a thin film and deposited electrical interconnections can alternatively be used.

Returning to FIG. 1, scanning device 210 and thermal sensor array 100 may comprise individual elements or may be integrated onto a common dielectric layer 216. A multiplexer unit 213 can be used to multiplex data for transmission to the scanning device and thereby reduce the interconnection complexity. Multiplexer 213 may be integrated with the sensor array and/or the scanning device, or multiplexer 213 may comprise a separate element.

The thermal sensor array can be used in a manual mode by being pressed into contact with a surface 214 to be measured. Alternatively, a fixturing device 218 for positioning the thermal sensor array in contact with the surface 214 can be used to more precisely control the placement and the pressure on the thermal sensor array. In some applications, the fixturing device can be useful to reduce tissue thickness in the direction of interest to enhance detection capability.

In one embodiment, as shown in FIG. 2, fixturing device 218 comprises a base 219 which comprises a substantially rigid structural material such as an injection molded lightweight polycarbonate, and a substantially flexible thermocouple array 100 which is coupled to base 219 by a mechanically flexible media 221 such as low thermal conductivity backing material or multiple springs, for example. In one embodiment, the backing material comprises a foam rubber.

Referring again to FIG. 1, in one embodiment, computer 212 (for receiving data via a data link 217) includes a data acquisition unit 220 which is used to acquire streams of multiplexed data, a data processing unit 224 for forming temporal sequences of spatial thermal maps, and an archiving unit 226 for storing the thermal maps.

Data processing unit 224 may include signal/image processing software or methods to enhance regions of the thermal maps based on local statistics or other image properties. Signal analysis takes into account the temporal variation of observed signals due to perturbation of the skin thermal boundary conditions. The fact that early time data can have steeper gradients than later time data due to heat diffusion can be accounted for in producing a thermographic image of the skin surface. Also, for highest sensitivity, individual temperature variation of sensors in the array can be averaged out. That is, the sensor array can be on a much finer scale than the expected temperature gradient profiles, thus allowing for signal smoothing to be implemented for neighboring sensors. An algorithm for such smoothing can be implemented.

For data acquisition and processing, the sensor elements can be spaced to provide desired resolution with oversampling. That is, if 1 mm resolution is desired, the sensors can be positioned on a 0.5 mm (or smaller) grid. Thus, multiple signals will enhance detection confidence. Oversampling can also be accomplished by physically shifting the sensor array position—such movement can be incorporated by the fixturing device. Data can be reconstructed with over-sampling or by statistically combining adjacent points to enhance the effects of the over-sampling. Methods for removing thermal signals due to known underlying anatomical features (e.g., blood vessels) can be incorporated if patients are monitored repeatedly.

The computer may additionally include other elements such as a display 228, a keyboard 232, a printer 234, a controller 230, and a central processing unit 222 (CPU) to integrate operation of the data acquisition unit, the data processing unit, and the archiving unit, for example. The computer can perform analysis directly, send the data to a remote computer for further analysis, and/or send information to a human specialist (via a satellite, for example) to obtain expert advice. In one embodiment, the computer obtains information from the controller or a remote computer and provides the information to scanning device 210 for regulating multiplexer 213.

As shown in the embodiment of FIG. 2, the diagnostic tool can be used, for example, for diagnosing breast cancer by situating the thermal sensor array on a surface comprising a breast, scanning sensor signals from the thermal sensors via the pattern of deposited electrical interconnections, and processing the sensor signals to estimate temperature distributions indicative of breast cancer. The fixturing device or manual pressure can be used to reduce tissue thickness in directions of interest. This embodiment of the present invention thus can provide a noninvasive, harmless technique for measuring spatial temperature gradients (variation across the tissue) and/or temporal temperature gradients (variation with time) in biological tissue for screening of early tumor development or for monitoring for the effects of tumor therapy, particularly for the effects of anti-angiogenesis therapy which is designed to attack the tumor blood supply directly.

Different patient positions have different advantages with the present invention. Lying a patient on her back results in the breast tissue spreading out such that tissue thickness (through which the thermal signals need to penetrate) is naturally minimized; minimizes the motion of the breasts; and provides a position of comfort.

Lying a patient on her stomach with a hole on the table through which the breasts extend minimizes transverse thickness, minimizes breast motion, and provides a position of comfort. Depending on the fixturing, having a patient sit or stand upright can minimize sensor array positioning time required for the lying down positions. The appropriate position for sensing will additionally vary depending on the nature of the clinical use. For screening of an asymptotic breast, full, unbiased, thorough, and accurate coverage is important to maximize sensitivity. For diagnosing a suspected cancer, the goal of positioning is to provide the best information about the suspicious region of the breast.

Furthermore, it can be useful to mark the surface to be measured with dots, lines, or a grid to assist in positioning of the fixturing device, particularly if the thermal sensor array will be used in more than one position of the surface. In one example, a black, non-permanent marker is used to provide marking for aligning multiple thermal images taken at different positions.

It is further useful to provide an array of sufficient size (such as 25 centimeters by 25 centimeters, for example) so that one position can be used for measurement purposes. In an alternative embodiment, a plurality of arrays are simultaneously positioned for simultaneous measurements.

Figure 3:
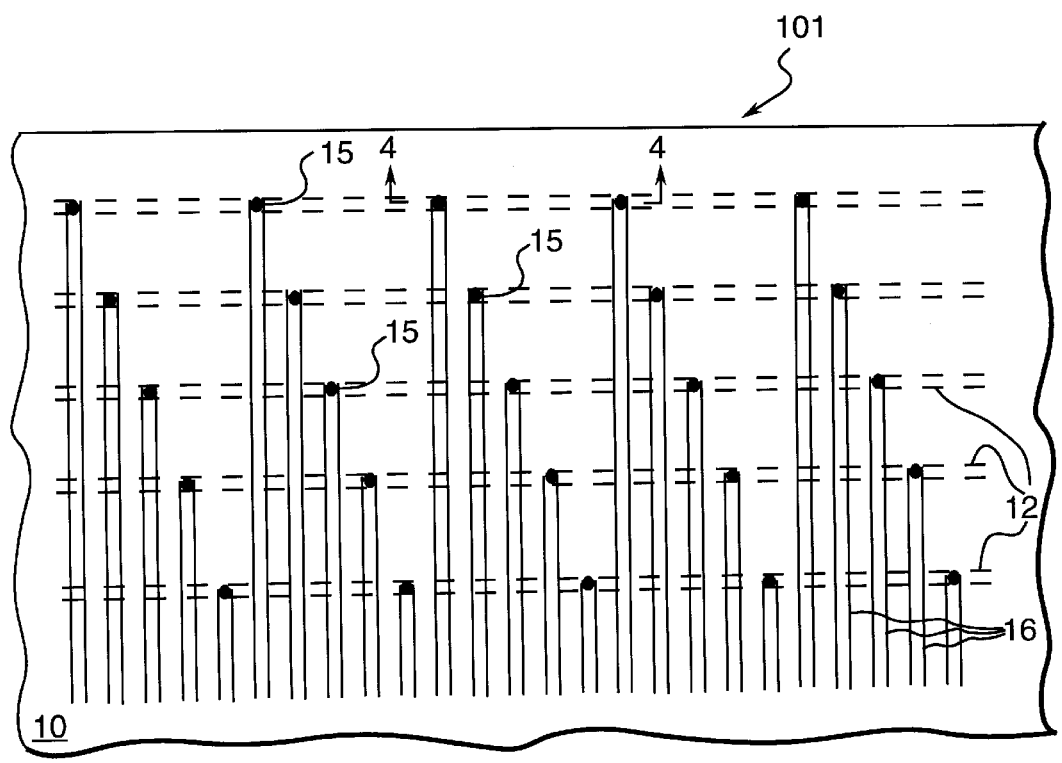
FIGS. 3–4 are respective top and side views of a thermocouple array according to one embodiment of the present invention.
Figure 4:
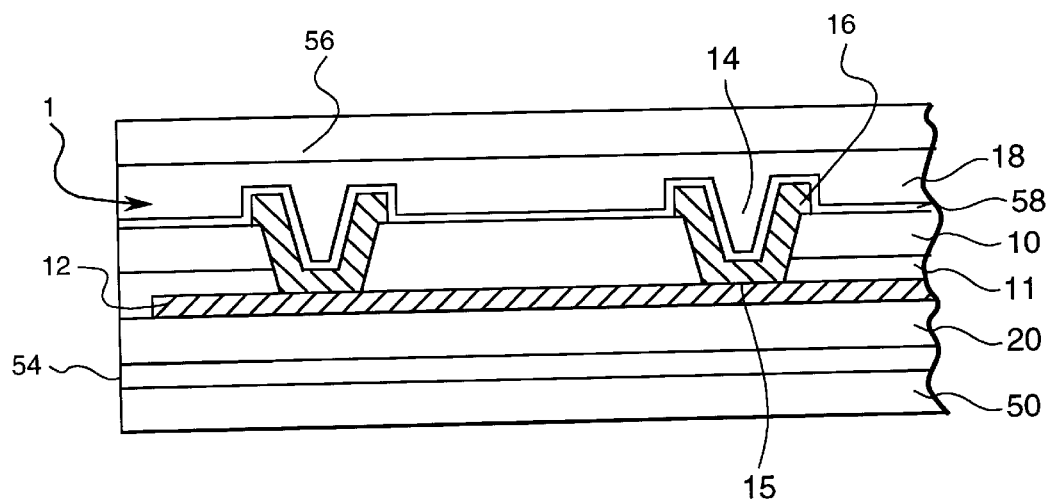

FIGS. 3–4 are respective top and side views of a thermocouple array 101 according to one embodiment of the present invention. In this embodiment, the thermocouple array includes a first patterned conductive layer 12 facing one surface of a dielectric layer 10 and the pattern of deposited electrical interconnections comprises a second patterned conductive layer 16 facing the other surface of dielectric layer 10. The first and second patterned conductive layers have different thermal emfs. Dielectric layer 10 has vias 14 therethrough, and at least some of the individual thermal sensors comprise thermocouples 1 including joints 15 formed through the vias between the first and second patterned conductive layers. The term "facing" is meant to include situations wherein another material, such as an adhesive, for example, can be present between a conductive layer and the dielectric layer.

In one embodiment, a support layer 20 is laminated with an adhesive 54, for example, on a removable support carrier 50. The support carrier may comprise any structurally appropriate material which can withstand processing temperatures of the thermocouple array fabrication. In one embodiment, support carrier 50 comprises copper. Support layer 20 may comprise a low dielectric constant material such as a polymer. A useful material for adhesive 54 when the support carrier comprises copper and the support layer comprises a polymer is a siloxane polyetherimide block copolymer, for example.

First patterned conductive layer 12 can be applied to dielectric layer 10 by any appropriate technique. In the embodiment of FIG. 4, first patterned conductive layer 12 is applied to dielectric layer 10 by first being applied to support layer 20 and then having dielectric layer 10 situated over the first patterned conductive layer. First patterned conductive layer 12 can be applied to the support layer by any appropriate technique such as, for example, spraying, sputtering, or lamination with an adhesive (not shown) either before or after the support layer is attached to the support carrier. The first patterned conductive layer can be applied in an unpatterned sheet form and then patterned with photoresist using conventional photolithographic techniques to produce a series of electrical runs, for example.

The appropriate material for dielectric layer 10 will depend upon the intended use and environment of the thermocouple array. A material such as KAPTON™ polyimide (KAPTON is a trademark of E.I. duPont de Nemours & Co.) or UPILEX™ polyetherimide (UPILEX is a trademark of UBE Industries, Ltd.) provides a rugged and abrasion-resistant array but is not as easily conformed to complex surface topologies such as female breast tissue as are silicone rubber membranes which provide greater flexibility. Dielectric layer 10 can be applied by techniques such as spinning, spraying, or, as shown, using an adhesive 11. In one embodiment, adhesive 11 comprises an SPI (siloxane polyimide)-epoxy blend.

Vias 14 can be formed in dielectric layer 10 using a mechanical punching process, a chemical etch process, or a laser drilling process such as described in Eichelberger et al., U.S. Pat. No. 4,894,115, issued Jan. 6, 1990, and Eichelberger et al., U.S. Pat. No. 4,835,704, issued May 30, 1989, for example. The vias can be cleaned using a reactive ion etching process to provide a clean surface of the first patterned conductive layer on the bottoms of the vias.

Second patterned conductive layer 16 can be applied either before or after the dielectric layer is attached to the support layer and/or the first patterned conductive layer by any appropriate technique such as, for example, spraying, sputtering, or lamination with an adhesive (not shown). In one embodiment wherein the second patterned conductive layer is applied after the dielectric layer is attached, the second patterned conductive layer is sputtered or evaporated onto the top of dielectric layer 10 and through the vias to extend to each exposed portion of first patterned conductive layer 12. The second patterned conductive layer can be patterned in the same manner as the first patterned conductive layer.

Individual thermoelectric materials (in this example, the first and second patterned conductive layers) are frequently characterized for practical purposes by a quantity called thermal emf (electromotive force). The term "thermal emf" herein means the thermal emf per degree of temperature unit of the material relative to platinum. A thermal emf can be a positive or a negative number and is typically expressed in units of microvolts per degree Celsius ($\mu v/° C$.). The first and second patterned conductive layers must have sufficiently different thermal emfs to produce a useful electrical output signal. The sensitivity of the voltage measuring equipment used in a particular application will affect what difference in thermal emfs is sufficient for practical measurement purposes.

In one embodiment, the first and second patterned conductive layers each have a thickness ranging from about 2 micrometers to about 4 micrometers to minimize the cross section of the resulting thermal shunt and thereby to minimize the thermal conductivity and the likelihood of disturbing the thermal field to be measured. The thermocouples of the present invention can be patterned very finely. For example, if the width of the lines in the patterned conductive layers is about 0.05 mm, the spacing between lines is about 0.05 mm, and the diameter of a patterned via is about 0.1 mm, then a 15 row thermocouple array can be situated in an area with a pitch of 1.65 mm.

In a preferred embodiment, one of the first and second patterned conductive layers comprises constantan (an alloy of about 55% copper and 45% nickel) and the other of the first and second patterned conductive layers comprises copper. At a temperature of 200° C., for example, the thermal emf of copper is +9.15 $\mu v/°$ C. and the thermal emf of constantan is −37.25 $\mu v/°$ C. with the difference in thermal emf being 46.4 $\mu v/°$ C. Another example embodiment is copper and an alloy of Ni 90% and Cr 10% (having a thermal emf at 200° C. of 29.8 $\mu v/°$ C.) which have a thermal emf difference of about 67 $\mu v/°$ C. One pair of conductive layers with a very high difference in thermal emf (765 $\mu v/°$ C.) is germanium (+362 $\mu v/°$ C.) and silicon (−403 $\mu v/°$ C.). Pairs of conductive layers with a very low thermal emf difference (about 1 $\mu v/°$ C.) include platinum and rhodium alloys. For practical applications, the thermal emf difference will typically range from about 1 $\mu v/°$ C. to about 67 $\mu v/°$ C.

The above examples of one patterned conductive layer comprising a material having a positive thermal emf and the other patterned conductive layer comprising a material having a negative thermal emf are for purposes of illustration only. The significant factor is that the two patterned conductive layers have sufficiently different thermal emfs, even if both are positive or both are negative. Either of the layers can be applied first. In a preferred embodiment, the patterned conductive layer which will be positioned closest to the region to be sensed will be the first patterned conductive layer so that the contact between the first and second patterned conductive layers will be as close to the region as possible.

Whereas the above description is of an interconnect system having the interconnections between patterned conductive layers 12 and 16 directly through dielectric layer 10, it is possible to have both conductive layers interconnected through vias to another interconnect pattern (not shown) through another dielectric layer (such as support layer 20). Similarly, it is possible to pattern two conductive layers on one surface of the dielectric layer, pattern an other layer comprising one of the two conductive layer materials on the opposite surface, and form vias and interconnections down to the other layer. These embodiments can be used to minimize the lateral thermal conductivity of the thermocouple array.

In the embodiment of FIG. 3 the thermocouple array is a grid of rows and columns with conductive vias (not shown) being present to selectively couple the patterned conductive layers. Other types of arrays such as those described in aforementioned U.S. Pat. No. 5,909,004 can alternatively be used.

FIG. 4 further illustrates an additional dielectric layer 18 which can be added using an adhesive 58, for example, after the first and second patterned conductive layers to provide mechanical protection for the thermocouple array. The material used for additional dielectric layer 18 will vary according the specific application and may comprise a material such as a polymer for example. After thermocouple array fabrication is complete, the thermocouple array can be removed from support carrier 50 by peeling support layer 20 from the support carrier or by dissolving adhesive layer 54 using an appropriate solvent. Alternatively, the support carrier can remain attached. If the support carrier remains attached, its material and thickness are chosen such that its flexibility and thermal properties are compatible with the array requirements.

One of the additional dielectric and the support layers (18 or 20) will be placed closest to the surface to be sensed, and this layer is preferably a low mass, low thermal conductivity material that is as thin as feasible so that its thermal mass does not interfere with the temperature measurements and the spatial and temporal resolutions are thus maximized. In one embodiment, the thickness ranges from about 20 micrometers to about 50 micrometers and the material comprises TEFLON™ polytetrafluoroethylene (TEFLON is a trademark of E.I. duPont de Nemours & Co.), silicone rubber, or latex, for example.

The other of the additional dielectric and the support layers (18 or 20) which is not in contact with the sensed surface in some applications may be sufficiently thick so as to provide a thermal barrier from air flow. In one embodiment, the material comprises a polyurethane foam having a thickness ranging from about 3 millimeters to 3 centimeters which can optionally be fitted with a backing or support material (shown as layer 56 for purposes of example) if needed for enhanced mechanical stability. The backing material may comprise silicon rubber having a thickness range of about 100 micrometers to about 6000 micrometers, for example. Covering both patterned conductive layers can provide for smooth surfaces and permit sterilization of the materials.

The flexible arrays can be placed in direct contact with and conform to the surface to be measured. Direct contact with the material reduces temperature effects due to the air interface that results when direct contact is not achieved.

FIGS. 5–8 are side views showing several thermocouple embodiments related to those of FIGS. 3–4. Although FIGS. 3–4 illustrated substantially smooth array surfaces, the sensors can alternatively be fabricated with modified surfaces as shown in FIGS. 5–8. FIG. 5 illustrates an embodiment without an additional dielectric layer or support layer underlying dielectric layer 10. Additional portions 19 of second patterned conductive layers 16 can provide connections to thermocouple junctions not shown in the cross sectional views of FIG. 4.

FIG. 6 illustrates an embodiment wherein dielectric layer 110 is thinned in selected areas 13 to about forty percent to about 60 percent of its original thickness. These selected areas do not include portions 17 of the dielectric layer facing first patterned conductive layer 12. Thinning can be performed by reactive ion etching or other etching techniques, for example. Thinning both further exposes the first patterned conductive layer and reduces the lateral thermal conductance of the dielectric layer. If the first patterned conductive layer must be electrically isolated from the sensed surface, a protective layer 22 comprising a material such as thin silicone rubber, for example, having a thickness ranging from about 10 micrometers to about 25 micrometers can be deposited as shown in FIG. 7. The layer can be present over the entire surface or alternatively be patterned or applied only over the first patterned conductive layer as shown by protective layer 122 in FIG. 8. In another embodiment (shown as element 9 in FIG. 5 by dashed lines) the thickness of first patterned conductive layer 12 is increased in the areas of the thermocouple joints to provide extra height for protruding sensor locations.

Figure 9:
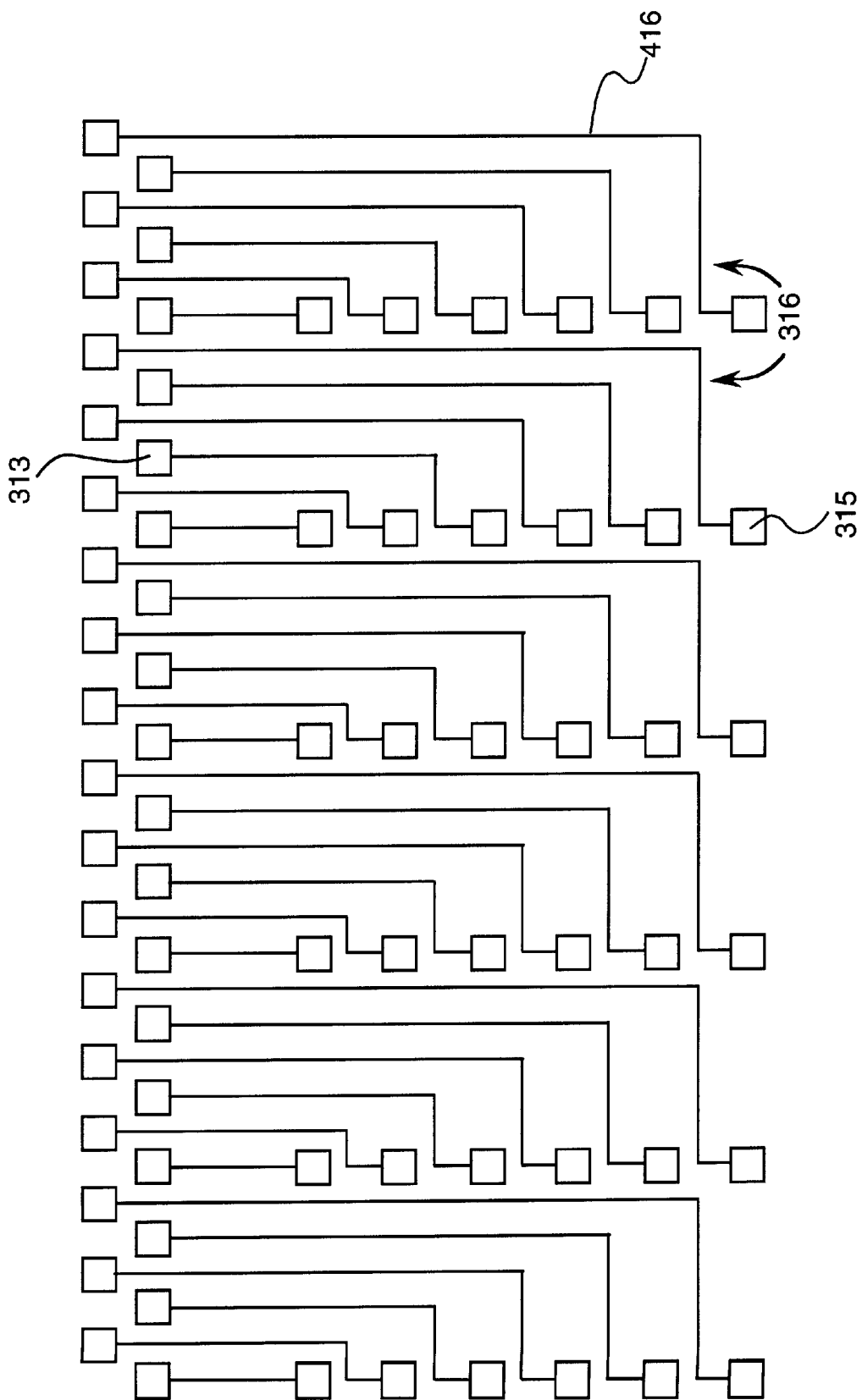
FIGS. 9–12 are circuit schematic top views showing several thermocouple array connection embodiments of the present invention.
Figure 10:
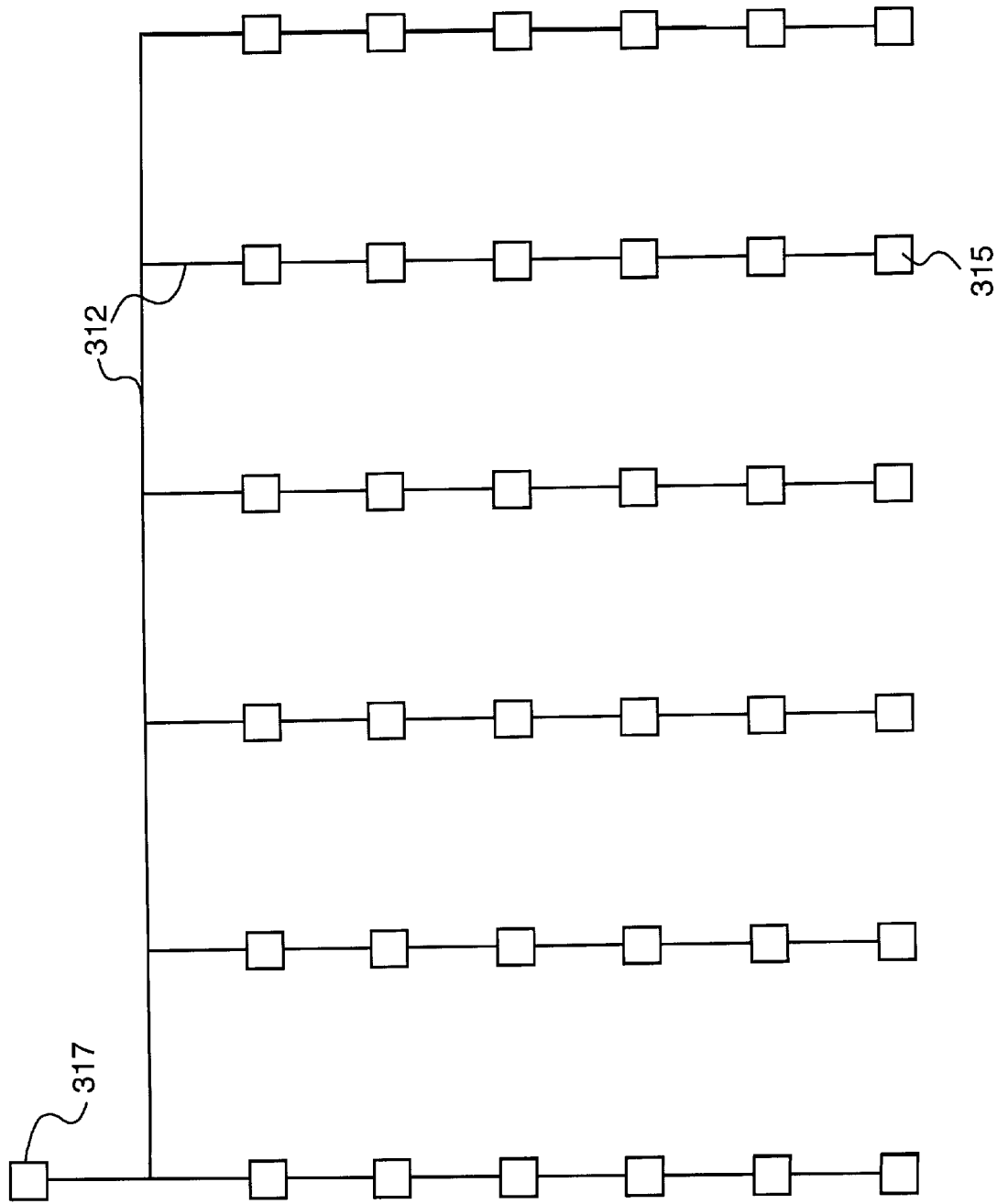
Figure 11:
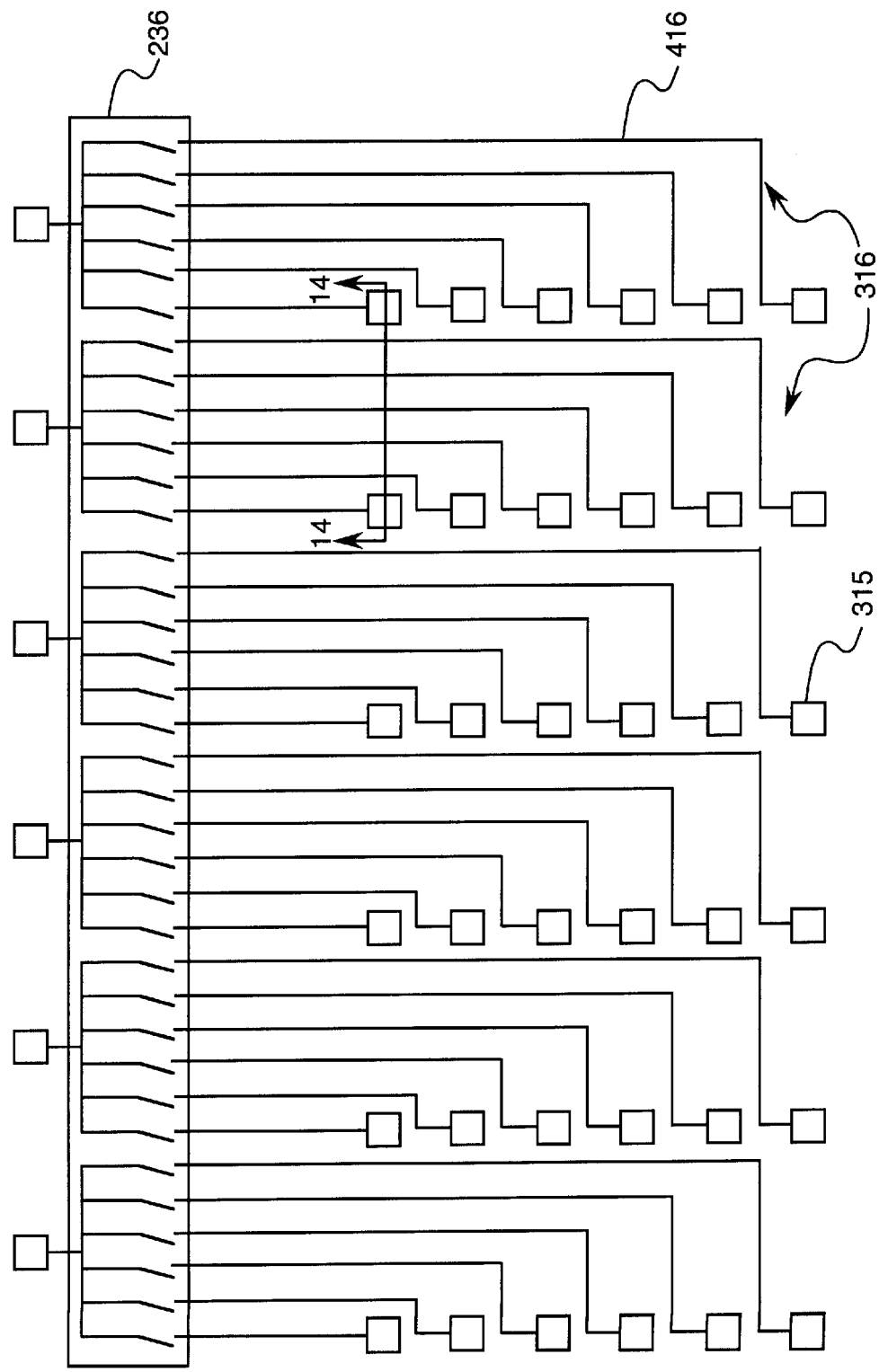
Figure 12:
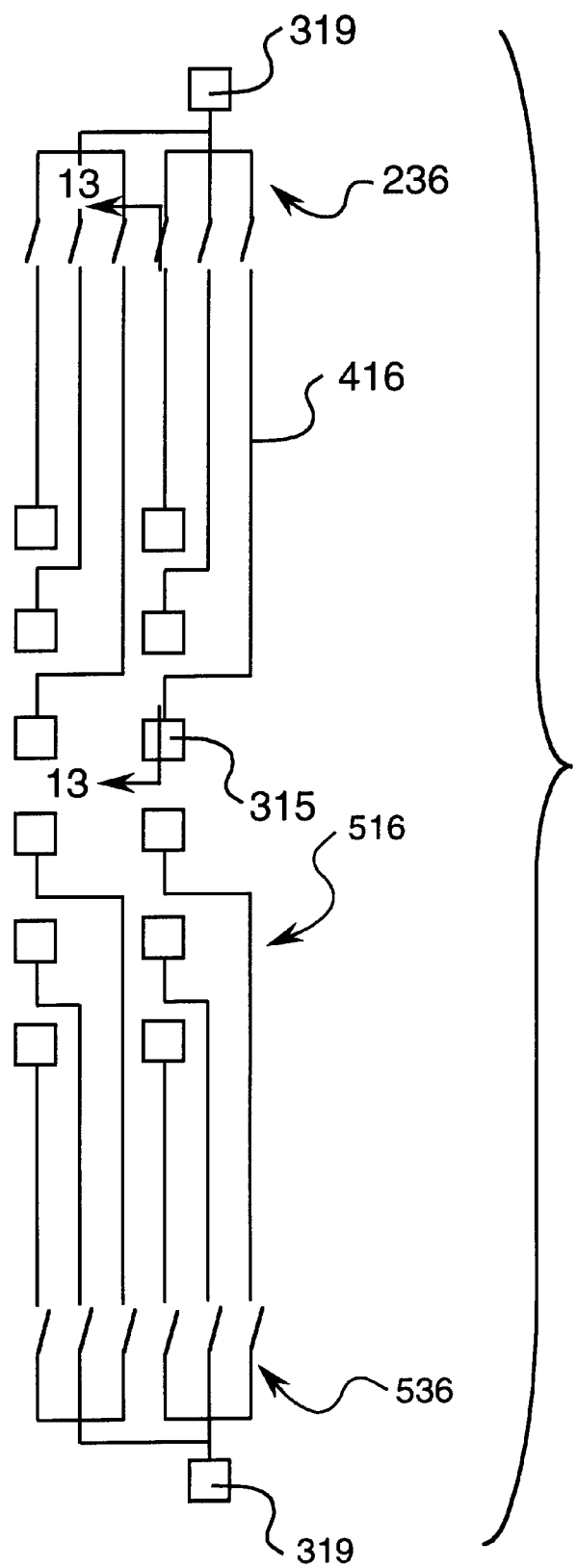

FIGS. 9–12 are circuit schematic top views showing several thermocouple array connection embodiments, and FIGS. 13 and 14 are side views of portions of FIGS. 11 and 12.

In FIGS. 9 and 10, the pattern of deposited electrical conductors used for providing electrical connections from thermocouple joints 315 include a first patterned conductive layer 312 (FIG. 10) on one surface of the dielectric layer (layer 10 shown in FIGS. 3–4) including a common electrical interconnection coupling all of the thermal sensors to one or more common terminals (represented by terminal 317) and a second patterned conductive layer 316 (FIG. 9) on another surface of the dielectric layer including a plurality of separate connections 416 each coupling a respective one of the thermal sensors. In FIG. 9, each of the separate connections 416 is coupled to a separate terminal 313. Because each thermocouple junction generates a voltage proportional to the difference in temperature of the junction and the reference junction, the junctions of first patterned conductive layer 312 can be connected, as shown, to terminal 317.

In FIGS. 11 and 12, at least one multiplexer 236, is used with each of the plurality of separate connections being coupled to the at least one multiplexer. In these embodiments, less terminals are required and thus scanning device 210 of FIG. 1 would not need to include as many connections to the array. A single multiplexer can be used, or several multiplexers can be situated on a common side of the thermal sensors or, as shown in FIG. 12, wherein the at least one multiplexer includes at least two multiplexers (236 and 536), situated on opposing sides of the thermal sensors, to modify spacing requirements between sensors. FIG. 12 further shows an embodiment wherein connections from multiplexers are coupled in parallel to simplify output connections to terminals 319. It is useful for the rows and columns of thermal sensors to be spaced apart substantially equally as shown in FIG. 12.

FIG. 13 is a sectional view along line 13—13 of FIG. 12 which illustrates one example of how a multiplexer can be integrated with dielectric layer 10. In FIG. 13, multiplexer 236 is coupled over dielectric layer 10 to connection 416 via an electronic assembly technique such as a flip chip or ball grid array technique with additional dielectric layer 18 extending over the multiplexer and dielectric layer 10. In an alternative embodiment, shown by dashed lines in FIG. 13, multiplexer 336 is embedded within dielectric layer 10. In other embodiments, different electronic assembly techniques such as wire bonding (not shown) can be used to connect a multiplexer to connections 416, for example.

FIG. 14 is a sectional view along line 14—14 of FIG. 11 which illustrates dimensions useful for determining sensor density options. In FIG. 14, connections 416 are Wc wide, space between connections is Ws wide, and a width of a thermocouple is Wt. In this example, the distance Dt between rows of thermocouples as a function of the number of rows N for a layout as shown in FIG. 11 is given (for a single layer of interconnection) by:

$$Dt=Wt+(N-1)*(Ws+Wc)+Ws.$$

The number of sensors per unit width is given by 1/Dt. For typical connection and space widths of 0.05 mm and thermocouple widths of 0.1 mm, the sensor pitch can be 1.65 mm for a sixteen row array or 2.65 mm for a twenty -six row array. By using the double-sided connection system of FIG. 12 instead of the single-sided connection system of FIG. 11, the sensor pitch of sixteen and twenty-six row arrays would be 0.85 and 1.35 mm respectively.

Figure 15:
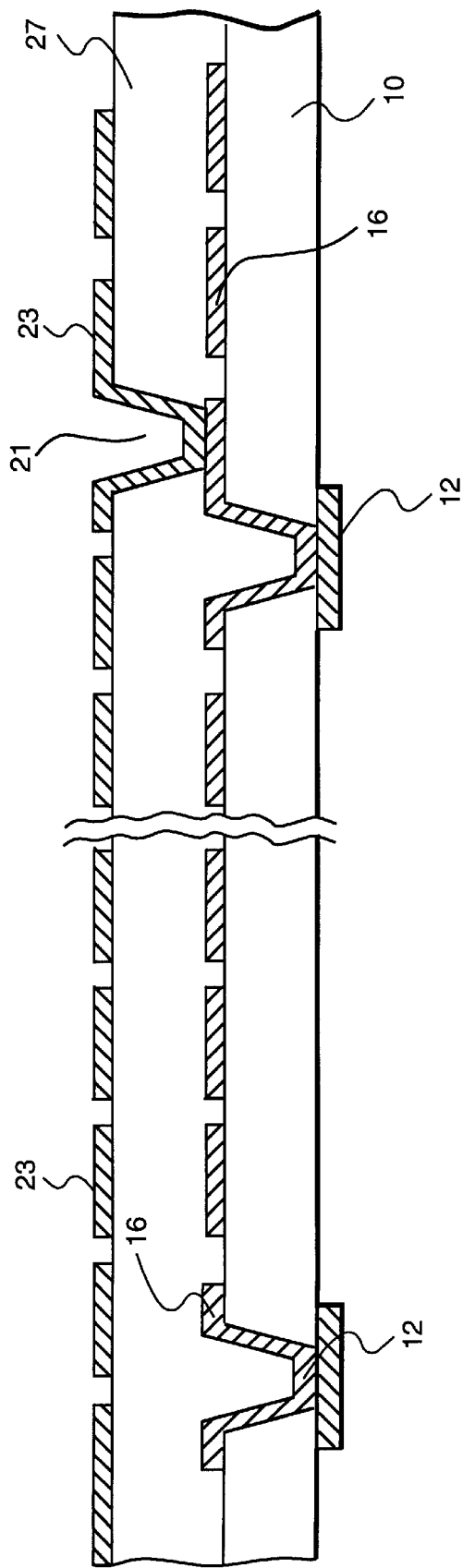
FIG. 15 is a side view illustrating an embodiment of the present invention including multi-layer interconnections.

FIG. 15 is a side view illustrating an embodiment of the present invention including multi-layer interconnections which can be used to decrease the pitch of the columns. Although two layers are shown, additional layers can be added as appropriate. In this embodiment, a second dielectric layer 27 overlies the first dielectric layer 10 and the pattern of deposited electrical interconnections (which is shown for purposes of example in FIG. 15 as second patterned conductive layer 16). Second dielectric layer 27 has second dielectric layer vias 21 extending to selected portions of the pattern of deposited electrical interconnections. Furthermore, an additional pattern of deposited electrical interconnections 23 extends over the second dielectric layer into the second dielectric layer vias and is coupled to the pattern of deposited electrical interconnections. In one embodiment, the additional pattern of deposited electrical interconnections 23 comprises the same material as second patterned conductive layer 16 so that additional thermocouple junctions are not formed by the interconnections of the two materials. The additional pattern of deposited electrical interconnections 23 can be used to fabricate a larger thermal sensor array by increasing the number of sensing locations without increasing the sensor spacing.

Figure 16:
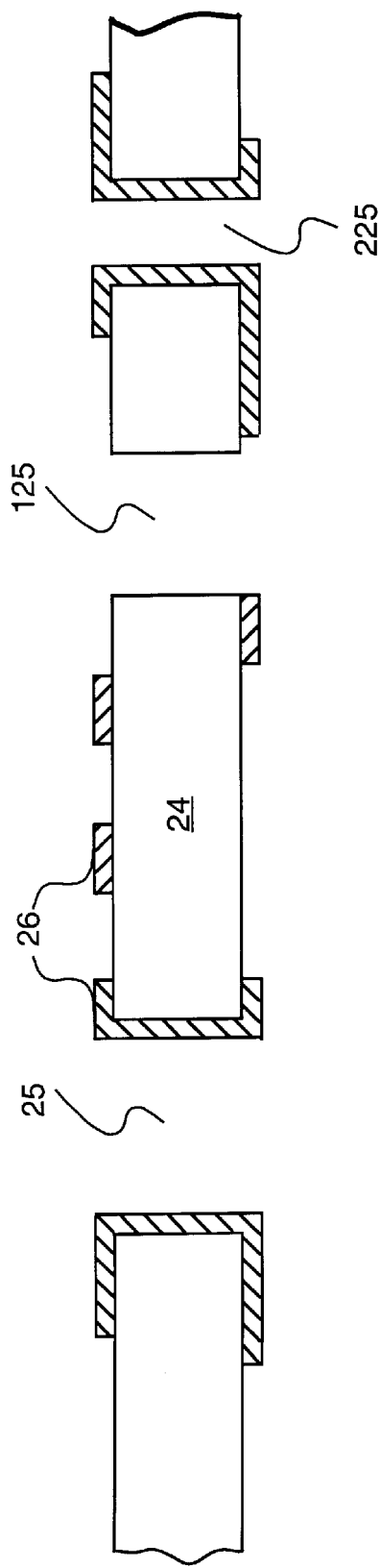
Figure 17:
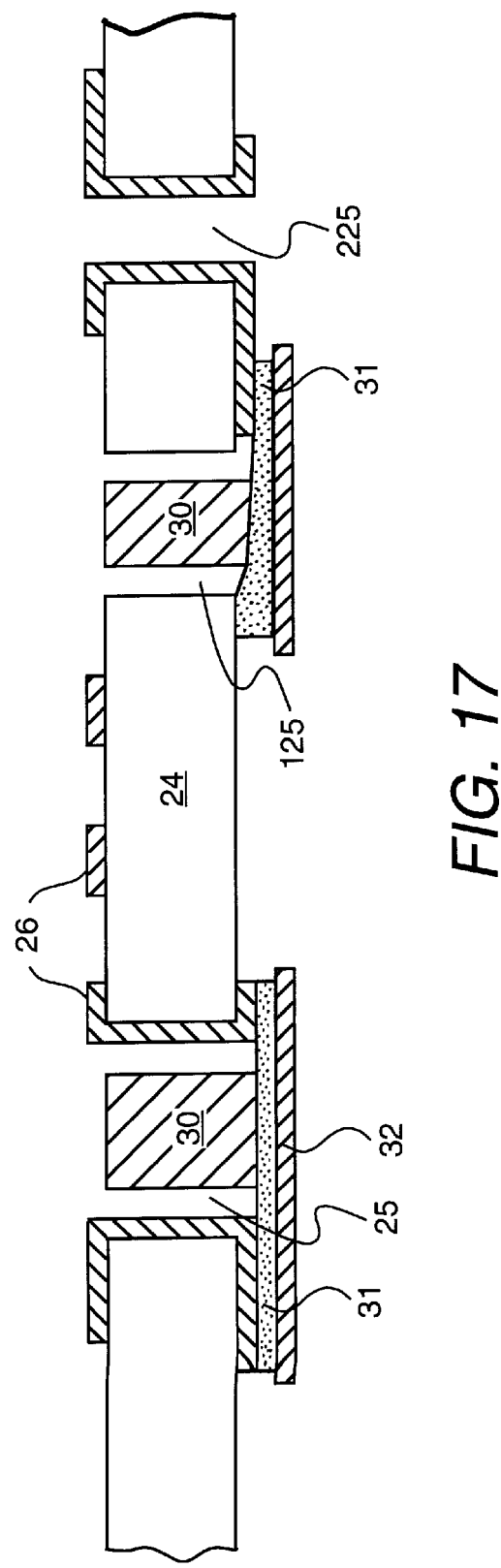

FIGS. 16–18 are side views of stages in a thermistor array 102 fabrication sequence according to another embodiment of the present invention. In this embodiment, dielectric layer 24 has vias 25 and/or 125 and 225 therethrough, and at least some of the individual thermal sensors comprise thermistors 30 situated at least partially within the vias. Thermistors are useful due to their high change in resistance (about 10 to about 15 percent per degree centigrade) as a function of temperature.

FIG. 16 illustrates dielectric layer 24 which may comprise low thermal conductivity, low thermal mass materials similar to those discussed above with respect to dielectric layer 10 and the layer 20 or 18 to be placed closest to the surface to be sensed. Typically the thickness of dielectric layer 24 is similar to the height of the thermistor and ranges from about 0.125 millimeters to about 0.25 millimeters. Vias can be formed in the dielectric layer by drilling, mechanical punching, laser etching, or water jet pressure, for example.

Patterned conductive material 26 can then be applied to the vias and surfaces of dielectric layer 24 in a similar manner as printed circuit board metallization by a combination of electroless and electro-deposition of copper followed by patterning. In the embodiment of FIGS. 16–18, the patterned conductive material in vias 25 and 225 couples opposing surfaces of the dielectric layer. Patterned conductive material 26 can optionally be removed or excluded from selected vias 125.

As shown in FIGS. 17 and 18, at least one electrically conductive element 32 can be coupled to one of the opposing surfaces and to a thermistor 30, and an additional dielectric layer 118 can be coupled to another of the opposing surfaces. The additional dielectric layer has a plurality of additional dielectric layer vias 114 extending to the thermistors and to the patterned conductive material, and the pattern of deposited electrical interconnections 112 extends through the additional dielectric layer vias.

In an embodiment wherein via 25 includes patterned conductive material 26, the material can be used for coupling the at least one electrically conductive element 32 to a top surface of dielectric layer 24. In an embodiment wherein a via 125 does not include patterned conductive material 26, then coupling to a top surface can be provided by interconnection to an additional via 225 that includes patterned conductive material 26. Although shown in a single figure for purposes of illustration, typically the two embodiments will not be combined. Although more vias are needed for the embodiment wherein a thermistor via 125 is not metallized, fabrication is simpler than the embodiment with metallized vias 25 where there is a risk of short circuits between thermistor 30 and patterned conductive material 26 extending along the via walls.

In one embodiment, electrically conductive element 32 comprises a strap coupled to patterned conductive material 26 and to thermistor 30 with an electrically conductive adhesive 31. In one embodiment the strap comprises copper having a thickness ranging from about 25 micrometers to about 50 micrometers and the conductive adhesive comprises a conductive epoxy. Coupled thermistor 2 can then be interconnected by an additional dielectric layer 118 and the pattern of deposited electrical interconnections 112. If desired. connections can be formed on dielectric layer 24 in addition to the connections formed on additional dielectric layer 118 for the purpose of increasing thermal sensor density and/or decreasing area requirements.

FIG. 19 is a side view of an alternative thermistor array embodiment fabrication stage wherein at least one electrically conductive element 132 is coupled to dielectric layer 24 with at least some of the vias 25 extending to the at least one electrically conductive element. In one embodiment, patterned conductive material 126 extends through the vias and is coupled to the at least one electrically conductive element. The thermistor is then coupled to the patterned conductive material. In one embodiment, the coupling is accomplished with electrically conductive adhesive 31.

Again, an additional dielectric layer (shown as 118 in FIG. 18) and pattern of deposited electrical interconnections 112 can be used for interconnecting the thermistor. In a similar manner as with FIGS. 16–18, via 125 need not include patterned conductive material 126.

Although one method of fabrication of the thermistor array has been described in detail, other methods such as mounting the thermistors on a thin conductor foil and subsequently laminating a pre-punched dielectric layer can be used to eliminate the need for placing individual thermistors in the vias.

FIG. 20 is a circuit schematic top view of a thermistor array embodiment of the present invention. As shown in FIG. 20, selected ones of the first or second portions 112 or 113 of the pattern of deposited electrical interconnections can include common electrical interconnections to terminals 119. In an embodiment wherein each thermistor has a height of 0.2 mm and sides 117 about 0.5 mm long, similar sensor pitches can be achieved as those discussed above with respect to FIG. 14. If desired, terminals 119 can be coupled in parallel and/or terminals 121 can be coupled in parallel. Such coupling reduces the number of connections but can increase the complexity of scanning device 210 (FIG. 1).

FIG. 21 is a circuit schematic top view of a resistance temperature detector array 103 embodiment of the present invention. In this embodiment, at least some of the individual thermal sensors comprise resistance temperature detectors (RTDs) 3 patterned on dielectric layer 10.

More specifically, the RTDs may comprise portions of the pattern of deposited electrical interconnections 41 selectively patterned to form areas of high resistance. In one embodiment, the connections are patterned with areas 34 that include thin serpentine lines that are about 25–50 micrometers wide, about 250–1000 micrometers long and, about 0.2 to 4 micrometers high. Typical variations of an RTD resistance with respect to temperature variations are about 0.4 percent to about 0.6 percent per degree centigrade for common metals such as copper, nickel, and titanium that can be used as interconnection materials, for example. The RTD array can be fabricated using simplified manufacturing processes since there is no need for two dissimilar patterned conductive layer materials or individual thermistors.

Array 103 can be arranged, for example, with each RTD having a four terminal connection 134 embodiment commonly referred to as a Kelvin connection. If the switches are situated on the dielectric layer, multiplexer integrated circuit chips are useful. If the switches are situated off the dielectric layer, reed relay switches can be used. In the embodiment of FIG. 21, current is forced through the RTD through connection lines 36 while voltage developed across the RTD is measured by means of connection lines 138 or 238 which are connected directly to the RTD. This technique eliminates errors due to voltage drops in the RTD leads and interconnections. The connections can be reduced somewhat by connecting all of the RTD current connections in series during a measurement cycle.

The number of switches 239 and 339 can be reduced (with a small decrease in accuracy) by forming the pattern of deposited electrical interconnections to provide portions 138 extending between two RTDs rather than portions 238 which are coupled closer to each RTD.

Figure 22:
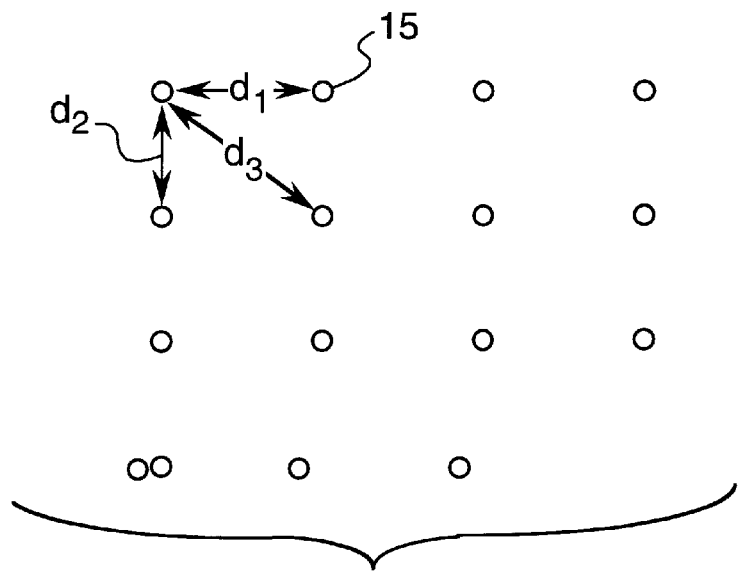
FIG. 22 illustrates a rectangular grid for sensors.
Figure 23:
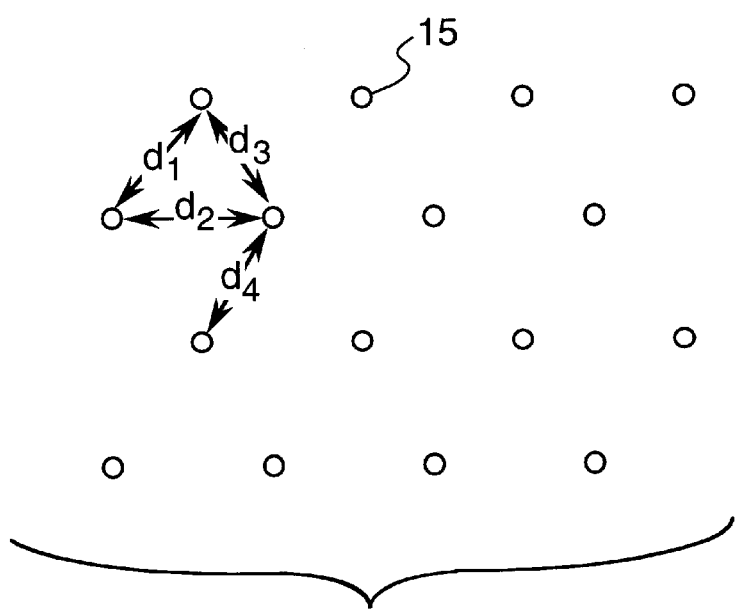
FIG. 23 illustrates a triangular grid for sensors according to one embodiment of the present invention.

FIG. 22 illustrates a rectangular grid for sensors, and FIG. 23 illustrates a triangular grid for sensors according to one embodiment of the present invention. Although the previous examples generally shown rectangular grids of thermal sensors, positioning sensors on a triangular grid as shown in FIG. 23 can be useful. In the embodiment of FIG. 23, the plurality of individual thermal sensors are spaced in a triangular grid such that the distance between each respective sensor and each neighboring sensor is substantially the same.

Uniform spacing of the triangular grid is not provided by the rectangular grid and can increase the spatial resolution of the sensor array without increasing the number of sensor elements per square centimeter. Additionally, the triangular grid can reduce the total number of sensors required for a given spatial resolution thereby reducing the sensor cost and complexity of the associated electronic circuitry.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A diagnostic tool comprising:
   a thermal sensor array including a dielectric layer including a plurality of individual thermal sensors and a pattern of deposited electrical interconnections facing at least one surface of the dielectric layer and providing electrical connections with each of the plurality of individual thermal sensors;
   a scanning device coupled to the pattern of deposited electrical interconnections for obtaining sensor signals from the thermal sensors; and
   a computer for processing the sensor signals to estimate temperature distributions.

2. the diagnostic tool of claim 1 wherein the dielectric layer and the pattern of deposited electrical interconnections are surface-conformable.

3. The diagnostic tool of claim 2 further including a fixturing device for positioning the thermal sensor array in contact with a surface to be measured.

4. The diagnostic tool of claim 3 wherein the fixturing devices comprises:
   a substantially rigid base; and
   a mechanically flexible media for mechanically coupling the thermal sensor array to the base.

5. The diagnostic tool of claim 2 wherein the computer includes a data acquisition unit for acquiring the sensor signals from the scanning device.

6. The diagnostic tool of claim 5 wherein the computer further includes a data processing unit forming spatial thermal maps from the sensor signals.

7. A method for diagnosing breast cancer comprising:
situating, on a breast, a thermal sensor array including a dielectric layer including a plurality of individual thermal sensors and a pattern of deposited electrical interconnections facing at least one surface of the dielectric layer and providing electrical connections with each of the plurality of individual thermal sensors;
scanning sensor signals from the thermal sensors via the pattern of deposited electrical interconnections; and
processing the sensor signals to estimate temperature distributions indicative of breast cancer.

8. The method of claim 7 wherein the dielectric layer and the pattern of deposited electrical interconnections are surface-conformable.

9. The method of claim 8 further including using a fixturing device for positioning the thermal sensor array in contact with the breast.

10. The method of claim 7 further including, prior to situating the thermal sensor array on the breast, providing at least one alignment mark on the breast.

11. A thermal sensor array comprising:
a dielectric layer including a plurality of individual thermal sensors; and
a pattern of deposited electrical interconnections facing at least one surface of the dielectric layer and providing electrical connections with each of the plurality of individual thermal sensors.

12. The thermal sensor array of claim 11 wherein the dielectric layer and the pattern of deposited electrical interconnections are surface-conformable.

13. The array of claim 12 wherein the dielectric layer comprises a first dielectric layer and further including
a second dielectric layer overlying the first dielectric layer and the pattern of deposited electrical interconnections, the second dielectric layer having second dielectric layer vias extending to selected portions of the pattern of deposited electrical interconnections, and
an additional pattern of deposited electrical interconnections extending over the second dielectric layer into the second dielectric layer vias and coupled to the pattern of deposited electrical interconnections.

14. The array of claim 12 wherein the pattern of deposited electrical conductors includes:
a first patterned conductive layer on one surface of the dielectric layer including a common electrical interconnection coupling all of the thermal sensors; and
a second patterned conductive layer on another surface of the dielectric layer including a plurality of separate connections each coupling a respective one of the thermal sensors.

15. The array of claim 14 further including at least one multiplexer, wherein each of the plurality of separate connections is coupled to the at least one multiplexer.

16. The array of claim 15 wherein the at least one multiplexer includes at least two multiplexers situated on opposing sides of the thermal sensors.

17. The array of claim 11 further including: a first patterned conductive layer on one surface of the dielectric layer having a different thermal emf than the pattern of deposited electrical interconnections, wherein the dielectric layer has vias therethrough, the pattern of deposited electrical interconnections comprises a second patterned conductive layer), and at least some of the individual thermal sensors comprise thermocouples comprising joints formed through the vias between the first and second patterned conductive layers.

18. The array of claim 17 wherein the first patterned conductive layer includes portions at the joints having thicknesses greater than the thicknesses of other portions of the first patterned conductive layer.

19. The array of claim 17 wherein the dielectric layer is thinned in selected areas, the selected areas not including portions of the dielectric layer facing the first patterned conductive layer.

20. The array of claim 19 further including a protective layer overlying the first patterned conductive layer.

21. The array of claim 11 wherein the dielectric layer has vias therethrough and wherein at least some of the individual thermal sensors comprise thermistors situated at least partially within the vias.

22. The array of claim 21 further including
patterned conductive material coupling opposing surfaces of the dielectric layer;
an electrically conductive element coupled to one of the opposing surfaces and to at least one of the thermistors;
an additional dielectric layer coupled to another of the opposing surfaces, the additional dielectric layer having a plurality of additional dielectric layer vias, some of the additional dielectric layer vias extending to the thermistors and others of the additional dielectric layer vias extending to the patterned conductive material,
the pattern of deposited electrical interconnections extending through the additional dielectric layer vias and including first portions coupled to thermistors and second portions coupled to the patterned conductive material.

23. The array of claim 22 wherein selected ones of the first or second portions of the pattern of deposited electrical interconnections include common electrical interconnections.

24. The array of claim 21 further including
at least one electrically conductive element coupled to one of the opposing surfaces with at least some of the vias extending to the at least one electrically conductive element,
patterned conductive material extending through the vias and coupled to the at least one electrically conductive element with at least one of the thermistors coupled to the patterned conductive material,
an additional dielectric layer coupled to another of the opposing surfaces, the additional dielectric layer having a plurality of additional dielectric layer vias, at least one of the additional dielectric layer vias extending to the at least one of the thermistors and others of the additional dielectric layer vias extending to the patterned conductive material,
the pattern of deposited electrical interconnections extending through the additional dielectric layer vias.

25. The array of claim 21 further including
at least one electrically conductive element coupled to one of the opposing surfaces with at least some of the vias extending to the at least one electrically conductive element,
patterned conductive material extending through some of the vias with at least one of the thermistors coupled to the at least one electrically conductive element in an other of the vias, an additional dielectric layer coupled to another of the opposing surfaces, the additional dielectric layer having a plurality of additional dielectric layer vias, some of the additional dielectric layer vias extending to the at least one of the thermistors and others of the additional dielectric layer vias extending to the patterned conductive material, the pattern of deposited electrical interconnections extending through the additional dielectric layer vias.

26. The array of claim 11 wherein at least some of the individual thermal sensors comprise resistance temperature detectors (RTDs) patterned on the dielectric layer.

27. The array of claim 26 wherein the RTDs comprise portions of the pattern of deposited electrical interconnections selectively patterned to form areas of high resistance.

28. The array of claim 26 wherein the pattern of deposited electrical interconnections includes voltage measurement connections with two voltage measurement connections being coupled to each RTD, and current supply connections with each current supply line supplying current to one or more of the RTDs.

29. The array of claim 28 wherein the voltage measurement and current supply connections are selectively coupled to respective voltage measurement and current supply lines.

30. The array of claim 11 wherein the plurality of individual thermal sensors are spaced in a triangular grid such that the distance between each respective sensor and each neighboring sensor is substantially the same.

31. A method for fabricating a thermal sensor array comprising:

providing a dielectric layer including a plurality of individual thermal sensors; and depositing a pattern of electrical interconnections facing at least one surface of the dielectric layer and providing electrical connections with each of the plurality of individual thermal sensors.

32. The method of claim 31 further including depositing a first patterned conductive layer on the other surface of the dielectric layer having a different thermal emf than the pattern of deposited electrical interconnections, wherein the dielectric layer has vias therethrough, the pattern of deposited electrical interconnections comprises a second patterned conductive layer, and at least some of the individual thermal sensors comprise thermocouples comprising joints formed through the vias between the first and second patterned conductive layers; and thinning the dielectric layer in selected areas, the selected areas not including portions of the dielectric layer facing the first patterned conductive layer.

33. The method of claim 31 wherein providing the dielectric layer comprises forming vias therethrough and situating thermistors at least partially within the vias.

34. The method of claim 31 wherein -providing the dielectric layer including a plurality of individual thermal sensors and depositing the pattern of electrical interconnections include pattering resistance temperature detectors (RTDs) on the dielectric layer.

* * * * *